(12) United States Patent
Yin

(10) Patent No.: US 6,535,020 B1
(45) Date of Patent: Mar. 18, 2003

(54) OUTPUT BUFFER WITH COMPENSATED SLEW RATE AND DELAY CONTROL

(75) Inventor: Ming Yin, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/024,884

(22) Filed: Dec. 18, 2001

(51) Int. Cl.[7] .......................................... H03K 19/0175
(52) U.S. Cl. .............................. 326/83; 321/86; 321/26
(58) Field of Search .............................. 321/83, 86, 26, 321/87

(56) References Cited

U.S. PATENT DOCUMENTS

| | | | | |
|---|---|---|---|---|
| 4,857,770 A | * | 8/1989 | Partovi et al. | 326/121 |
| 5,568,081 A | | 10/1996 | Lui et al. | 327/380 |
| 5,623,216 A | * | 4/1997 | Penza et al. | 326/26 |
| 5,850,159 A | * | 12/1998 | Chow et al. | 326/83 |
| 6,040,737 A | | 3/2000 | Ranjan et al. | 327/543 |
| 6,064,230 A | | 5/2000 | Singh | 326/83 |

* cited by examiner

Primary Examiner—Don Le
(74) Attorney, Agent, or Firm—William L. Paradice, III; M & P, LLP

(57) ABSTRACT

A circuit includes a drive transistor coupled between an output and a first potential, a constant current circuit coupled between the gate of the drive transistor and a second potential, and a compensation circuit coupled between the gate of the drive transistor and the first potential. The constant current circuit draws a current from the gate of the drive transistor to the second potential that is substantially independent of process and temperature variations, and therefore turns on the drive transistor at a constant rate, regardless of process and temperature variations. The compensation circuit draws a small current from the gate of the drive transistor to the first potential that is dependent upon process and temperature variations of the drive transistor, and therefore reduces the discharge rate of the gate of the drive transistor according to process and temperature variations of the drive transistor.

27 Claims, 5 Drawing Sheets

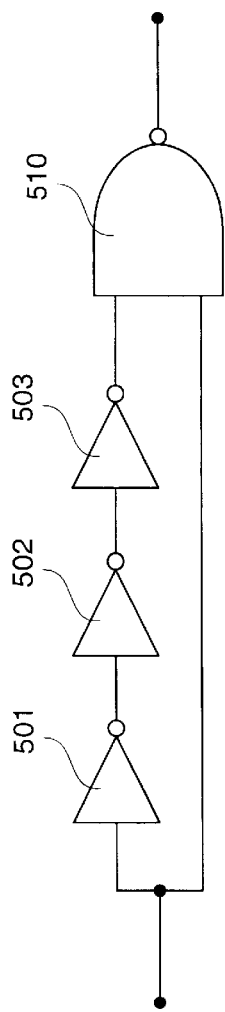
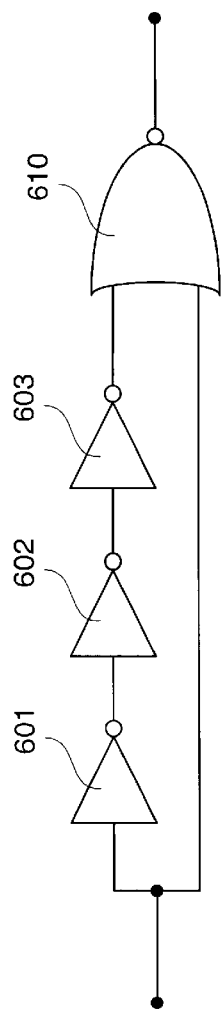
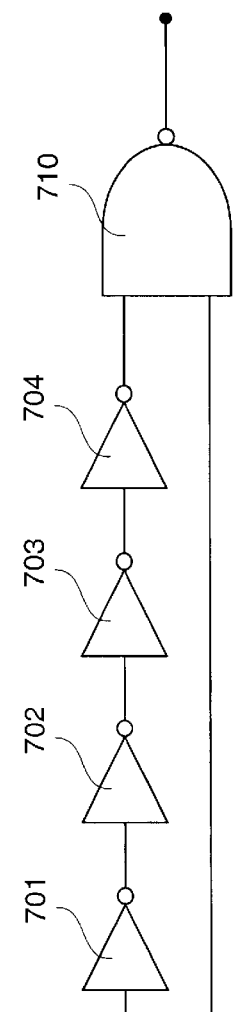
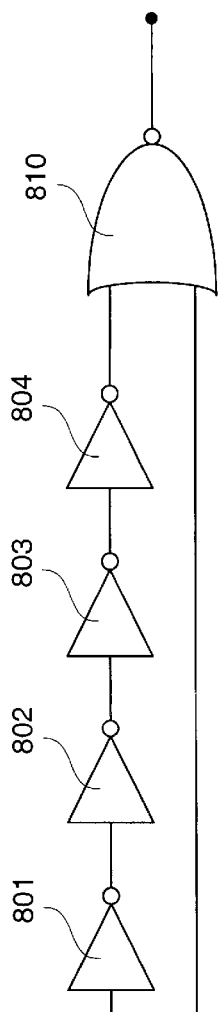

OUTPUT BUFFER WITH COMPENSATED SLEW RATE AND DELAY CONTROL

BACKGROUND

1. Field of Invention

This invention relates generally to digital logic systems and specifically to maintaining specified performance characteristics over process and temperature variations.

2. Description of Related Art

Modern electronic devices such as personal computers typically include a plurality of integrated circuit (IC) or semiconductor chips that communicate with each other, for example, via a common bus. Typically, each IC chip includes an output driver to drive signals from the IC chip onto the bus, or alternately, directly onto one or more other IC chips. The rate at which an output driver transitions a signal (e.g., logic low to logic high) is known as its slew rate, which is typically measured in volts per unit of time. In order to ensure circuit speed compatibility between IC chips and associated buses, the output drivers used in the IC chips should adhere to a specified slew rate range. If the specified slew rate is not met by an output driver, its host IC chip may not operate at the specified frequency, and may become incompatible with other chips or devices. Further, although higher operating frequencies are generally desired, if the slew rate is too high, e.g., the output driver charges the output signal too quickly, undesirable noise may be introduced into the output signal. As a result, it is important for the output drivers to maintain the specified slew rate at all times.

Conventional output drivers have several limitations.

First, as the physical dimensions of IC chips become smaller, it becomes more difficult to control the operating characteristics (e.g., slew rates) of the transistors therein. Process variations inherent in the fabrication of semiconductor chips often cause transistors of the same design to behave differently. For example, the amount of current provided by a transistor, which affects its slew rate, is dependent upon a number of factors including, for example, transistor size, gate-to-source voltage ($V_{GS}$), and manufacturing-related parameters. Although transistor size and $V_{GS}$ may be precisely controlled, manufacturing process characteristics typically vary between transistors because, for example, of imperfections in available doping technologies. Indeed, because implant doping is a chemical process performed over time, variations in dopant concentrations between transistors, especially between transistors fabricated from different wafers, are inevitable. These variations are even more pronounced for smaller devices, and may result in significant operating characteristic variations. As a result, output drivers of the same design and having the same specified operating characteristics may undesirably operate at different speeds, and therefore may have slew rates different from those specified.

Further, transistor operating characteristics vary with changes in temperature. Typically, transistors tend to operate more slowly as the IC chip heats up and, conversely, tend to operate more quickly as the IC chip cools down. As a result, the slew rate of conventional output drivers undesirably varies with temperature. Accordingly, changes in the operating temperature of an output driver may cause the output driver's slew rate to drift from its specified slew rate. This, in turn, may lead to unwanted noise and/or incompatibility with other devices.

Thus, there is a need for an improved output driver that maintains a specified slew rate over process and temperature variations of the drive transistor.

SUMMARY

A method and apparatus are disclosed that compensate for process and temperature variations in the drive transistor(s) of a circuit in order to maintain a specified slew rate that is independent of such process and temperature variations in the drive transistor(s). In accordance with the present invention, a circuit includes a drive transistor coupled between an output and a first potential, a constant current circuit coupled between the gate of the drive transistor and a second potential, and a compensation circuit coupled between the gate of the drive transistor and the first potential. The constant current circuit uses a constant current that is substantially independent of process and temperature variations to turn on the drive transistor at a constant rate, regardless of process and temperature variations. The compensation circuit provides a small compensation current that cancels some of the constant current and, thus, slightly decreases the turn-on rate of the drive transistor. The compensation current is dependent upon process and temperature variations of the drive transistor, and therefore reduces the turn-on rate of the drive transistor according to process and temperature variations of the drive transistor. In this manner, the output maintains a constant specified slew rate that does not drift in response to process and temperature variations in the drive transistor.

For one embodiment, the drive transistor is a PMOS transistor coupled between an output and a supply voltage, the constant current circuit is an NMOS pull-down transistor coupled between gate of the drive transistor and ground potential, and the compensation circuit is a PMOS transistor coupled between the gate of the drive transistor and the supply voltage. The pull-down transistor, which is controlled by a bias circuit, provides a current that is substantially independent of process and temperature variations, and therefore operates to discharge the gate of the PMOS drive transistor at a constant rate, regardless of process and temperature variations. The compensation transistor conducts a small current that cancels some of the constant current that discharges the gate of the drive transistor. The PMOS compensation transistor models the PMOS drive transistor, and thus tracks process and temperature variations in the drive transistor. Accordingly, the compensation current, which is dependent upon process and temperature variations of the drive transistor, adjusts the discharge rate of the gate of the PMOS drive transistor in response to process and temperature variations therein in order to maintain the specified output slew rate.

For example, if the drive transistor is weaker than normal due to process and/or temperature variations, and thus the output would ordinarily have a lower slew rate than specified, the compensation transistor is also weaker than normal, and thus conducts a weaker compensation current. The weaker compensation current cancels less of the constant discharge current than normal, thereby increasing the discharge rate of the gate of the drive transistor, which in turn increases the output slew rate back toward its specified value. Conversely, if the drive transistor is stronger than normal due to process and/or temperature variations, and thus the output would ordinarily have a higher slew rate than specified, the compensation transistor is also stronger than normal, and thus conducts a stronger compensation current. The stronger compensation current cancels more of the constant discharge current than normal, thereby decreasing the discharge rate of the gate of the drive transistor, which in turn decreases the output slew rate back toward its specified value.

For other embodiments, the drive transistor is an NMOS transistor coupled between the output and ground potential, the constant current circuit is a PMOS pull-up transistor coupled between gate of the drive transistor and the supply voltage, and the compensation circuit is an NMOS transistor coupled between the gate of the drive transistor and ground potential. For such embodiments, the NMOS compensation transistor is modeled after and tracks process and temperature variations in the NMOS drive transistor, thereby adjusting the output slew rate for process and temperature variations in the NMOS drive transistor by effectively canceling an amount of the charge current provided by the pull-up transistor in response to such process and temperature variations.

BRIEF DESCRIPTION OF THE DRAWINGS

The features and advantages of the present invention are illustrated by way of example and are by no means intended to limit the scope of the present invention to the particular embodiments shown, and in which:

FIGS. 5 and 6 are block diagrams of pulse generators used in one embodiment of the circuit of FIG. 1; and FIGS. 7 and 8 are block diagrams of delay circuits used in one embodiment of the circuit of FIG. 1.

Like reference numerals refer to corresponding parts throughout the drawing figures.

DETAILED DESCRIPTION

Present embodiments are discussed below in the context of an output driver 100 for simplicity only. It is to be understood that present embodiments may be implemented in any circuit, driver, or buffer to maintain a specified slew rate over process and temperature variations. Further, the polarity of control signals and semiconductor devices may be reversed as desired. Also, the specific configurations of various delay circuits, pulse generators, current mirrors, and compensation circuits may be altered as desired. Accordingly, the present invention is not to be construed as limited to specific examples described herein but rather includes within its scope all embodiments defined by the appended claims.

Figure 1:
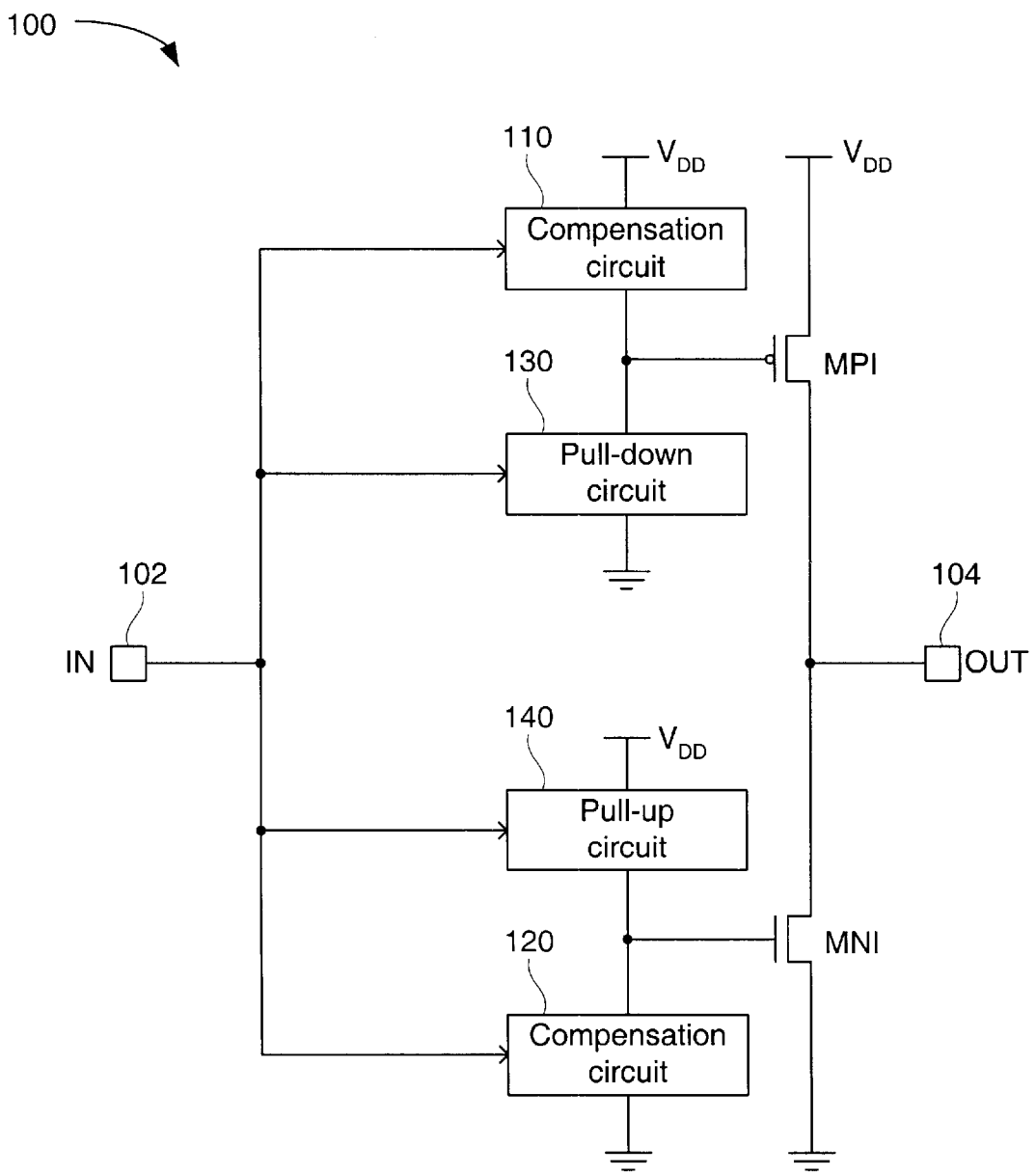
FIG. 1 is a block diagram of a circuit in accordance with one embodiment of the present invention.

FIG. 1 is a block diagram of a circuit 100 that, in accordance with the present invention, automatically compensates for process and temperature variations its drive transistor(s) to maintain a specified slew rate over such process and temperature variations. For one embodiment, circuit 100 may be used as an output driver, for example, to drive signals between IC chips, where an output signal OUT is driven in response to an input signal IN. Circuit 100 includes an input 102, an output 104, a PMOS drive transistor MP1, an NMOS drive transistor MN1, compensation circuits 110 and 120, a pull-down circuit 130, and a pull-up circuit 140. Input 102 receives input signal IN and, in response thereto, drive transistors MP1 and MN1 drive output signal OUT on output 104. Circuit 100 has a constant output slew rate that does not change with process and/or temperature variations. Specifically, the present invention maintains a specified slew rate for PMOS drive transistor MP1 over process and temperature variations of transistor MP1 by adjusting the rate at which its gate discharges during logic low-to-high transitions of output 104 according to those process and temperature variations and, similarly, maintains a specified slew rate for NMOS drive transistor MN1 over process and temperature variations of transistor MN1 by adjusting the rate at which its gate charges during logic high-to-low transitions of output 104 according to those process and temperature variations.

PMOS drive transistor MP1 is coupled between a supply voltage $V_{DD}$ and output 104, and drives output 104 to a high voltage when IN transitions from logic low to logic high. The gate of drive transistor MP1 is coupled between compensation circuit 110 and pull-down circuit 130, which in turn are coupled in series between $V_{DD}$ and ground potential. Compensation circuit 110 and pull-down circuit 130 are responsive to IN, and together control the discharge rate of drive transistor MP1's gate. The slew rate at output 104 for logic low-to-high transitions is controlled by PMOS drive transistor MP1, and is a function of the current, which depends on process and temperature variations, the size of drive transistor MP1, and the discharge rate of the gate of drive transistor MP1. Discharging the gate of PMOS drive transistor MP1 at a constant rate will result in a constant slew rate for output 104 during logic low-to-high transitions.

NMOS drive transistor MN1 is coupled between output 104 and ground potential, and drives output 104 to a low voltage when IN transitions from logic high to logic low. The gate of drive transistor MN1 is coupled between pull-down circuit 140 and compensation circuit 120, which in turn are coupled in series between $V_{DD}$ and ground potential. Compensation circuit 120 and pull-down circuit 140 are responsive to IN, and together control the charge rate of drive transistor MN1's gate. The slew rate at output 104 for logic high-to-low transitions is controlled by drive transistor MN1, and is a function of the current, which depends on process and temperature variations, the size of drive transistor MN1, and the discharge rate of the gate of drive transistor MN1. Charging the gate of NMOS drive transistor MN1 at a constant rate will result in a constant slew rate for output 104 during logic high-to-low transitions.

The operation of circuit 100 is as follows. When IN transitions from logic low to logic high, NMOS drive transistor MN1 turns off, for example, using a pull-down circuit (not shown in FIG. 1 for simplicity) coupled between MN1's gate and ground potential, although in some embodiments compensation circuit 120 may turn-off transistor MN1. Then, pull-down circuit 130 turns on and begins discharging the gate of drive transistor MP1 toward ground potential. As its gate falls below $V_{DD}$ plus its threshold voltage $V_T$, drive transistor MP1 turns on and charges output 104 toward $V_{DD}$ to pull signal OUT to logic high. Pull-down circuit 130 discharges MP1's gate with a constant current that is substantially independent of process and temperature variations, and thus operates to set up a constant discharge rate for MP1's gate over such process and temperature variations.

The logic high state of IN also turns on compensation circuit 110, which in turn slightly adjusts the output slew rate of drive transistor MP1 according to process and temperature variations therein. Compensation circuit 110 injects a small compensation current into the gate of drive transistor MP1 from $V_{DD}$, thereby canceling some of the discharge current provided by pull-down circuit 130, and therefore slightly reducing the discharge rate of MP1's gate. Because the amount of reduction in the discharge rate of MP1's gate is determined by the magnitude of the compensation current, the output slew rate of drive transistor MP1 may be adjusted for process and temperature variations therein by manipulating the compensation current. Specifically, compensation circuit 110 is modeled after and tracks process and temperature variations in drive transistor MP1. Thus, the compensation current is dependent upon process and temperature variations in drive transistor MP1, and automatically adjusts the discharge rate of MP1's gate according to process and temperature variations in MP1, which in turn maintains the specified low-to-high output slew rate over process and temperature variations in drive transistor MP1.

For example, suppose circuit 100 is designed to have a specified slew rate of X volts per second (v/s) for logic low-to-high transitions of output 104. Thus, if there are no process variations in the fabrication of circuit 100, and no temperature variations during operation of circuit 100, drive transistor 100 will pull output 104 from logic low to logic high at the specified slew rate X, as illustrated by line 202 in the graph 200 of FIG. 2. As mentioned above, the slew rate X (i.e., slope of line 202) is determined by the net discharge current, i.e., the difference between the compensation current provided by compensation circuit 110 and the discharge current provided by pull-down circuit 130. If, due to process and/or temperature variations, drive transistor MP1 has a greater drive strength or is otherwise faster than normal, drive transistor MP1 would be able to more quickly pull output 104 toward $V_{DD}$, which in turn would result in a greater low-to-high slew rate than specified, as indicated by line 204 in FIG. 2 having a slope of X+Δ.

Because compensation circuit 110 tracks process and temperature variations in drive transistor MP1, compensation circuit 110 will also have a greater drive strength than normal, and therefore will more strongly pull the gate of drive transistor MP1 toward $V_{DD}$. The greater compensation current reduces the discharge rate of MP1's gate more than normal, which in turn reduces the low-to-high slew rate of output 104 back toward its specified value of X, as indicated in FIG. 2 by arrow 206.

Figure 2:
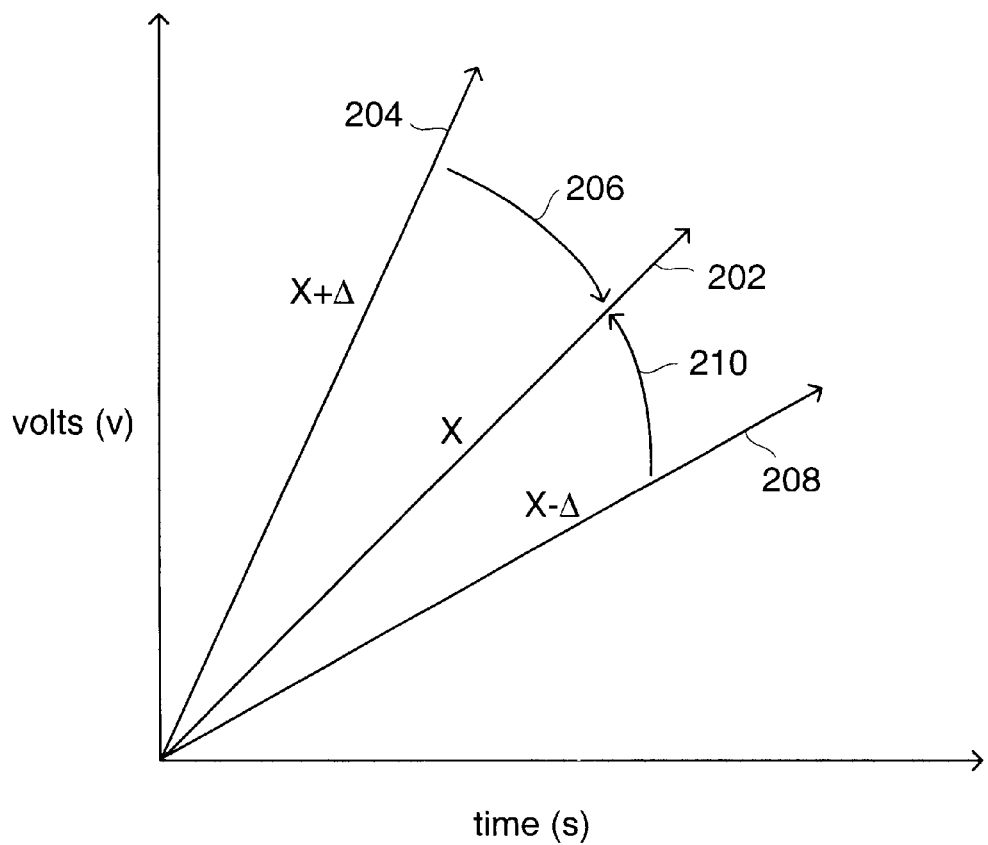
FIG. 2 is a voltage versus time graph illustrating slew rate adjustments for one embodiment of the drive transistor of the circuit of FIG. 1.

Conversely, if drive transistor MP1 is weaker than normal because of process and/or temperature variations, output 104 would otherwise have a lower slew rate than specified, as indicated by line 208 in FIG. 2 having a slope of X−Δ. Consequently, compensation circuit 110 will also have a lower drive strength than normal, and therefore will produce a lower compensation current than normal. The lower compensation current will not decrease the discharge rate of MP1's gate as much as normal, which in turn will increase the slew rate of output 104 back to its specified value of X, as indicated by arrow 210.

Therefore, by adjusting the discharge rate of MP1's gate in response to process and temperature variations therein, compensation circuit 110 maintains the specified slew rate for output 104 over process and temperature variations.

The operation of compensation circuit 120 and pull-down circuit 140 in maintaining a specified high-to-low slew rate for output 104 over process and temperature variations of drive transistor MN1 is identical to that described above with respect to PMOS drive transistor MP1, with polarities reversed. Thus, for example, when IN transitions from logic high to logic low, PMOS drive transistor MP1 turns off, for example, using a pull-up circuit (not shown in FIG. 1 for simplicity) coupled between MP1's gate and $V_{DD}$, although in some embodiments compensation circuit 110 may turn off transistor MP1. Then, pull-up circuit 140 begins pulling the gate of drive transistor MN1 toward $V_{DD}$. As its gate voltage reaches its $V_T$, drive transistor MN1 turns on and pulls output 104 toward ground potential. The charging rate of MN1's gate is adjusted for process and temperature variations of drive transistor MN1 in a manner similar to that described above with respect to compensation circuit 110 and pull-down circuit 120 in order to maintain the specified high-to-low slew rate. Thus, compensation circuit 120 adjusts the magnitude of its compensation current according to process and temperature variations of drive transistor MN1 to adjust the charging rate of MN1's gate in order to compensate for process and temperature variations of drive transistor MN1.

Figure 3:
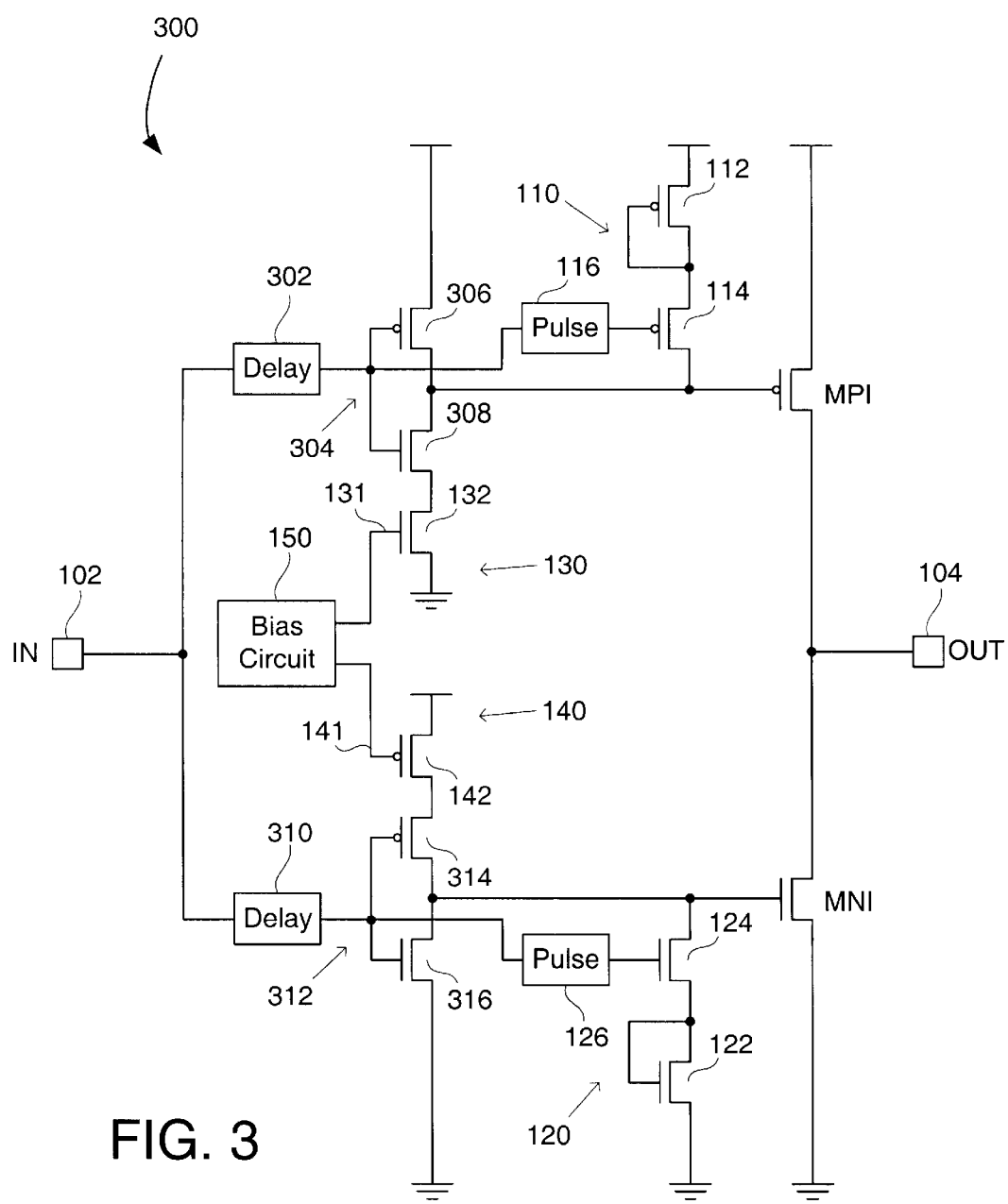
FIG. 3 is a circuit diagram of one embodiment of the circuit of FIG. 1.

FIG. 3 shows a circuit diagram of a circuit 300 that is one embodiment of circuit 100 of FIG. 1. Input 102 is coupled via delay circuit 302 to the input of a CMOS inverter 304 formed by PMOS transistor 306 and NMOS transistor 308. The output of inverter 304 is coupled to the gate of PMOS drive transistor MP1. The output of delay circuit 302 is also coupled to the gate of a PMOS compensation transistor 114 via a pulse generator 116. PMOS compensation transistor 114 and a PMOS diode-connected transistor 112 are coupled in series between $V_{DD}$ and the gate of PMOS drive transistor MP1. Together, PMOS transistors 112 and 114 and pulse generator 116 form compensation circuit 110 of FIG. 1. NMOS pull-down transistor 132 is coupled between inverter 304 and ground potential and, in response to a first control voltage provided at node 131 by bias circuit 150, provides a constant current that is substantially independent of process and temperature variations. Together, pull-down transistor 132 and bias circuit 150 form pull-down circuit 130 of FIG. 1.

As described above, compensation circuit 110 generates a current that is dependent upon process and temperature variations of PMOS drive transistor MP1. Specifically, when input 102 transitions from logic low to logic high, pulse generator 116 generates a pulse that turns on compensation transistor 114, which in turn injects current into the gate of drive transistor MP1 from $V_{DD}$ through diode 112, thereby effectively canceling some of the discharge current provided by pull-down transistor 132. The net discharge current will discharge MP1's gate at a constant rate. Diode-connected transistor 112 provides a voltage drop from $V_{DD}$ to reduce the voltage applied across compensation transistor 114, and in some embodiments may be eliminated.

In order to compensate for process and temperature variations of drive transistor MP1, PMOS compensation transistor 114 is modeled after drive transistor MP1. In one embodiment, PMOS compensation transistor 114 is much smaller than PMOS drive transistor MP1 in order to effectively track process and temperature variations in drive transistor MP1. Thus, if PMOS drive transistor MP1 is relatively weak due to process and/or temperature variations, PMOS compensation transistor 114 and PMOS diode 112 are also relatively weak, and therefore provide a smaller compensation current. The smaller compensation current results in a larger net current for discharging MP1's gate, which in turn increases the slew rate of output 104 back to its specified value. Conversely, if PMOS drive transistor MP1 is relatively strong due to process and/or temperature variations, PMOS compensation transistor 114 and PMOS diode 112 are also relatively strong, and therefore provide a larger compensation current. The larger compensation current results in a smaller net current for discharging MP1's gate, which in turn decreases the slew rate of output 104 back to its specified value. In this manner, PMOS compensation transistor 114 maintains the specified low-to-high slew rate for output 104 over process and temperature variations of PMOS drive transistor MP1.

Pulse generator 116 generates a pulse whose width is approximately equal to the rising time of the voltage at output 104 so that compensation transistor 114 is conductive only during this period of time. By limiting the duration of compensation transistor 114's on-time, pulse generator 116 advantageously saves power consumption, and allows the gate of PMOS drive transistor MP1 to be fully discharged to ground. For some embodiments, pulse generator 116 may be eliminated.

FIG. 5 shows a pulse generator 500 that is one embodiment of pulse generator 116 of FIG. 3. Pulse generator 500 includes inverters 501–503 coupled between delay circuit 302 and a first input of a NAND gate 510, which has a second input coupled to delay circuit 302 and an output to provide the pulse to compensation transistor 114. The duration of the pulse is determined by the gate delays of inverters 501–503, which may be conventional CMOS inverters, and NAND gate 510.

Input 102 is also coupled via delay circuit 310 to the input of a CMOS inverter 312 formed by PMOS transistor 314 and NMOS transistor 316. The output of inverter 312 is coupled to the gate of NMOS drive transistor MN1. The output of delay circuit 310 is also coupled to the gate of an NMOS compensation transistor 124 via a pulse generator 126. NMOS compensation transistor 124 and an NMOS diode-connected transistor 122 are coupled in series between the gate of NMOS drive transistor MN1 and ground potential. Together, NMOS transistors 122 and 124 and pulse generator 126 form compensation circuit 120 of FIG. 1. PMOS pull-up transistor 142 is coupled between inverter 312 and $V_{DD}$ and, in response to a second control voltage provided at node 141 by bias circuit 150, provides a constant. Together, pull-up transistor 142 and bias circuit 150 form pull-up circuit 140 of FIG. 1.

Compensation circuit 120 generates a current that is dependent upon process and temperature variations of NMOS drive transistor MN1. When input 102 transitions from logic high to logic low, pulse generator 126 generates a pulse that turns on compensation transistor 124, which in turn draws current from the gate of drive transistor MP1 toward ground potential through NMOS diode 122, thereby effectively canceling some of the charge current provided by pull-up transistor 142. The net current between the charge and compensation currents will charge the gate of drive transistor MN1 at a constant rate. NMOS diode-connected transistor 122 provides a voltage drop above ground potential to reduce the voltage applied across NMOS compensation transistor 124, and in some embodiments may be eliminated.

NMOS compensation transistor 124 is modeled after drive transistor MN1 in order to compensate for process and temperature variations of drive transistor MN1. In one embodiment, NMOS compensation transistor 124 is much smaller than NMOS drive transistor MN1 in order to effectively track process and temperature variations in drive transistor MN1. Thus, if NMOS drive transistor MN1 is relatively weak due to process and/or temperature variations, NMOS compensation transistor 124 and NMOS diode 122 are also relatively weak, and therefore provide a smaller compensation current. The smaller compensation current results in a larger net current for charging MN1's gate, which in turn increases the high-to-low slew rate of output 104 back to its specified value. Conversely, if NMOS drive transistor MN1 is relatively strong due to process and/or temperature variations, NMOS compensation transistor 124 and NMOS diode 122 are also relatively strong, and therefore provide a larger compensation current. The larger compensation current results in a smaller net current for charging MN1's gate, which in turn decreases the high-to-low slew rate of output 104 back to its specified value. In this manner, NMOS compensation transistor 124 maintains the specified output slew rate for NMOS drive transistor MN1 over process and temperature variations of NMOS drive transistor MN1.

Pulse generator 126 generates a pulse whose width is approximately equal to the falling time of the voltage at output 104 so that compensation transistor 124 is conductive only during this time period. By limiting the duration of compensation transistor 124's on-time, pulse generator 126 advantageously saves power consumption, and allows the gate of NMOS drive transistor MN1 to be fully charged to $V_{DD}$. For some embodiments, pulse generator 126 may be eliminated.

FIG. 6 shows a pulse generator 600 that is one embodiment of pulse generator 126 of FIG. 3. Pulse generator 600 includes inverters 601–603 coupled between delay circuit 310 and a first input of a NOR gate 610, which has a second input coupled to delay circuit 310 and an output to provide the pulse to compensation transistor 124. The duration of the pulse is determined by the gate delays of inverters 601–603, which may be conventional CMOS inverters, and NOR gate 610.

Figure 4:
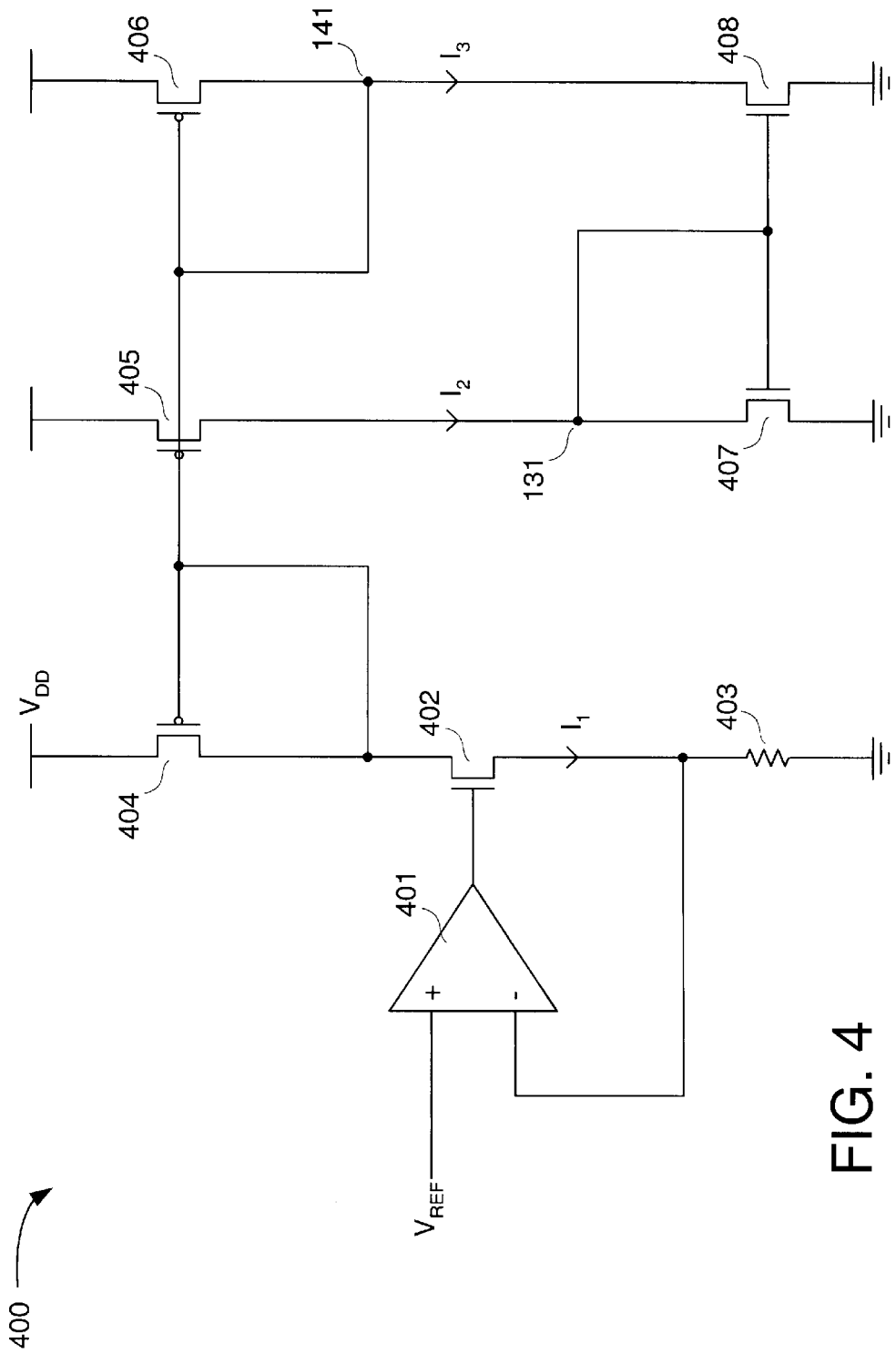
FIG. 4 is a circuit diagram of a bias circuit used in one embodiment of the circuit of FIG. 1.

FIG. 4 shows a bias circuit 400 that is one embodiment of bias circuit 150 of FIG. 3. Bias circuit 400 has a voltage-to-current converter including an operational amplifier 401, an NMOS conversion transistor 402, and a resistor 403, and has a current mirror including PMOS transistors. 404–406 and NMOS transistors 407–408. Together, the voltage-to-current converter and the current mirror provide gate voltages at nodes 131 and 141 that maintain constant currents through pull-down transistor 132 and pull-up transistor 142, respectively, irrespective of process and temperature variations.

Op-amp 401 includes a non-inverting input coupled to a reference voltage $V_{REF}$, an inverting input coupled between transistor 402 and resistor 403, and an output coupled to the gate of transistor 402. For one embodiment, $V_{REF}$ and resistor 403 are provided off-chip to ensure more accurate values. Op-amp 401 amplifies the voltage difference between its inverting and non-inverting inputs to produce a gate voltage for conversion transistor 402, which in response thereto provides a constant current through resistor 403 that has a value given by $I_1 \approx V_{REF}/R$, where R is the resistance of resistor 403. If, due to process and temperature variations, transistor 402 produces more current than normal in response to the same gate-to-source voltage, the current $I_1$ through resistor 403 increases accordingly. The higher current $I_1$ increases the voltage drop across resistor 403, which in turn causes the voltage at op-amp 401's inverting terminal to increase, thereby reducing the voltage differential at op-amp 401's inputs. As a result, op-amp 401 reduces the gate voltage of transistor 402, which in turn reduces the current $I_1$ through resistor 403. In this manner, the negative feedback loop provided by transistor 402 and resistor 403 maintains a constant current $I_1$ through resistor 403 that is substantially independent of process and temperature variations.

PMOS transistor 404 conducts current $I_1$, and is connected to PMOS transistors 405 and 406 as a current mirror. Thus, assuming PMOS transistors 405 and 406 are the same size as PMOS transistor 404, PMOS transistors 405 and 406 will conduct currents $I_2$ and $I_3$, respectively, that are equal to $I_1$. Similarly, NMOS transistors 407 and 408 are connected as a current mirror, and also conduct currents $I_2$ and $I_3$, respectively, if they are similarly sized. Because the current $I_1$ is compensated for process and temperature variations, the currents $I_2$ and $I_3$ are also compensated for process and temperature variations. Thus, because the gate of NMOS transistor 407 is coupled to the gate of NMOS pull-down transistor 132 via node 131, pull-down transistor 132 mirrors the current I2, and therefore discharges the gate of PMOS drive transistor MP1 at a constant rate over process and temperature variations. Similarly, because the gate of PMOS transistor 406 is coupled to the gate of PMOS pull-up transistor 142 via node 141, pull-up transistor 142 mirrors the current $I_3$, and therefore charges the gate of NMOS drive transistor MN1 at a constant rate over process and temperature variations.

Referring again to FIG. 3, delay circuits 302 and 310 are conventional delay elements that prevent a short circuit through drive transistors MP1 and MN1 by ensuring that during logic low-to-high transitions inverter 304 causes PMOS drive transistor MP1 to turn on after inverter 312 causes NMOS drive transistor MN1 to turn off and, conversely, that during logic high-to-low transitions, inverter 312 causes drive transistor MN1 to turn on after inverter 304 causes drive transistor MP1 to turn off. Delay circuits 302 and 312 may be conventional, and the delays provided thereby may be adjusted as desired to prevent a short circuit in the drive transistors MP1 and MN1. For one embodiment, delay circuits 302 and 310 may be eliminated.

FIG. 7 shows a delay circuit 700 that is one embodiment of delay circuit 302. Delay circuit 700 includes four inverters 701–704 coupled between input 102 and a first input of an AND gate 710, which has a second input coupled to input 102 and an output coupled to inverter 304. Delay circuit 700 delays logic low-to-high transitions at the input of inverter 304 by an amount determined by the propagation delays of its inverters 701–704.

FIG. 8 shows a delay circuit 800 that is one embodiment of delay circuit 310. Delay circuit 800 includes four inverters 701–704 coupled between input 102 and a first input of an OR gate 810, which has a second input coupled to input 102 and an output coupled to inverter 312. Delay circuit 800 delays logic high-to-low transitions at the input of inverter 312 by an amount determined by the propagation delays of its inverters 801–804.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A circuit for maintaining a specified slew rate over process and temperature variations, comprising:
    a drive transistor coupled between a first potential and an output of the circuit;
    a first transistor coupled between a gate of the drive transistor and a second potential, the first transistor responsive to an input signal, and operative to pull the gate voltage of the drive transistor toward the second potential at a constant rate during a logic transition of the input signal to turn on the drive transistor;
    a current source coupled between the first transistor and the second potential, the current source for generating a constant current that is substantially independent of process and temperature variations; and
    a compensation transistor coupled between the gate of the drive transistor and the first potential, the compensation transistor responsive to the input signal, and operative to decrease the rate of voltage change of the gate of the drive transistor by an amount dependent upon process and temperature variations in the drive transistor.

2. The circuit of claim 1, further comprising a second transistor coupled between the gate of the drive transistor and the first potential, the second transistor being responsive to the complement of the input signal.

3. The circuit of claim 1, further comprising a pulse generator coupled to the gate of the compensation transistor.

4. The circuit of claim 3, wherein the pulse generator generates a pulse having a width approximately equal to the transition time of the output.

5. The circuit of claim 1, wherein the compensation transistor models the drive transistor such that process and temperature variations in the compensation transistor track process and temperature variations in the drive transistor.

6. The circuit of claim 5, wherein the compensation transistor and the drive transistor are the same conductivity type.

7. The circuit of claim 1, further comprising a diode-connected transistor coupled between the compensation transistor and the first potential.

8. A circuit for maintaining a specified slew rate over process and temperature variations, comprising:
    a PMOS drive transistor coupled between a supply voltage and an output of the circuit;
    a pull-down transistor coupled between a gate of the drive transistor and ground potential, the pull-down transistor providing a discharge current to discharge the gate of the drive transistor during a first logic transition of an input signal in order to turn on the drive transistor at a constant rate;
    a first current source coupled between the pull-down transistor and ground potential, the first current source generating a constant current that is substantially independent of process and temperature variations; and
    a PMOS compensation transistor coupled between the gate of the PMOS drive transistor and the supply voltage, the PMOS compensation transistor injecting a small compensation current into the gate of the PMOS drive transistor during the first logic transition to reduce the discharge rate of the gate of the PMOS drive transistor by an amount dependent upon process and temperature variations of the PMOS drive transistor.

9. The circuit of claim 8, wherein the pull-down transistor and the compensation transistor are responsive to the input signal.

10. The circuit of claim 9, wherein the PMOS compensation transistor models the PMOS drive transistor such that process and temperature variations in the compensation transistor track process and temperature variations in the PMOS drive transistor.

11. The circuit of claim 8, wherein the compensation current is dependent upon process and temperature variations in the PMOS drive transistor.

12. The circuit of claim 8, further comprising a first pulse generator coupled to the gate of the PMOS compensation transistor.

13. The circuit of claim 12, wherein the first pulse generator generates a pulse whose width is approximately equal to a transition time of the output in response to the first logic transition.

14. The circuit of claim 8, further comprising:
an NMOS drive transistor coupled between the output and ground potential;
a pull-up transistor coupled between a gate of the NMOS drive transistor and the supply voltage, the pull-up transistor providing a charge current to charge the gate of the NMOS drive transistor during a second logic transition of an input signal in order to turn on the NMOS drive transistor at a constant rate; and
an NMOS compensation transistor coupled between the gate of the NMOS drive transistor and ground potential, the NMOS compensation transistor drawing a small compensation current from the gate of the NMOS drive transistor during the second logic transition to reduce the charge rate of the gate of the NMOS drive transistor by an amount dependent upon process and temperature variations of the NMOS drive transistor.

15. The circuit of claim 14, wherein the pull-up transistor and the NMOS compensation transistor are responsive to a complement of the input signal.

16. The circuit of claim 14, further comprising a second current source coupled between the pull-up transistor and the supply voltage, the second current source generating a constant current that is substantially independent of process and temperature variations.

17. The circuit of claim 14, wherein the NMOS compensation transistor models the NMOS drive transistor such that process and temperature variations in the NMOS compensation transistor track process and temperature variations in the NMOS drive transistor.

18. The circuit of claim 14, wherein the compensation current is dependent upon process and temperature variations in the NMOS drive transistor.

19. The circuit of claim 14, further comprising a pulse generator coupled to the gate of the NMOS compensation transistor.

20. The circuit of claim 19, wherein the second pulse generator generates a pulse whose width is approximately equal to a transition time of the output in response to the second logic transition.

21. A circuit for maintaining a specified slew rate over process and temperature variations, comprising:
a drive transistor coupled between a first potential and an output of the circuit;
a first transistor coupled between a gate of the drive transistor and a second potential, the first transistor responsive to an input signal, and operative to pull the gate voltage of the drive transistor toward the second potential at a constant rate during a logic transition of the input signal to turn on the drive transistor;
a compensation transistor coupled between the gate of the drive transistor and the first potential, the compensation transistor responsive to the input signal, and operative to decrease the rate of voltage change of the gate of the drive transistor by an amount dependent upon process and temperature variations in the drive transistor; and
a pulse generator coupled to the gate of the compensation transistor.

22. A circuit for maintaining a specified slew rate over process and temperature variations, comprising:
a drive transistor coupled between a first potential and an output of the circuit;
a current source coupled between a gate of the drive transistor and a second potential, the current source for generating a constant current that is substantially independent of process and temperature variations to pull the gate voltage of the drive transistor toward the second potential at a constant rate during a logic transition of the input signal to turn on the drive transistor; and
a compensation transistor coupled between the gate of the drive transistor and the first potential, the compensation transistor responsive to the input signal, and operative to decrease the rate of voltage change of the gate of the drive transistor by an amount dependent upon process and temperature variations in the drive transistor.

23. The circuit of claim 22, further comprising a first transistor responsive to the input signal and coupled between the current source and the gate of the drive transistor.

24. The circuit of claim 22, further comprising a second transistor responsive to the input signal and coupled between the gate of the drive transistor and the first potential.

25. The circuit of claim 22, further comprising a pulse generator coupled to a gate of the compensation transistor.

26. The circuit of claim 25, wherein the pulse generator generates a pulse whose width is approximately equal to a transition time of the output in response to the logic transition.

27. The circuit of claim 22, further comprising a diode-connected transistor coupled between the compensation transistor and the first potential.

* * * * *